United States Patent [19]

Kummer et al.

[11] 4,065,851

[45] Jan. 3, 1978

[54] METHOD OF MAKING METALLIC SUPPORT CARRIER FOR SEMICONDUCTOR ELEMENTS

[75] Inventors: Franz Kummer, Rodenbach; Gerhard Mai, Bruchkobel; Rolf Ruthardt, Hanau; Horst Thiede, Rossdorf, all of Germany

[73] Assignee: W. C. Heraeus GmbH, Hanau, Germany

[21] Appl. No.: 738,615

[22] Filed: Nov. 3, 1976

Related U.S. Application Data

[62] Division of Ser. No. 560,532, March 20, 1975, Pat. No. 4,027,326.

[30] Foreign Application Priority Data

Apr. 20, 1974 Germany .............................. 2419157

[51] Int. Cl.² .............................................. H01R 9/00
[52] U.S. Cl. ...................................... 29/630 R; 29/590
[58] Field of Search ............. 29/625, 626, 628, 630 R, 29/590; 264/61; 357/67, 70, 71

[56] References Cited

U.S. PATENT DOCUMENTS

| | | | |
|---|---|---|---|
| 3,537,175 | 11/1970 | St. Clair et al. | 29/590 |
| 3,589,000 | 6/1971 | Galli | 29/590 |
| 3,778,305 | 12/1973 | Holmes et al. | 29/630 R |

Primary Examiner—Lowell A. Larson
Attorney, Agent, or Firm—Flynn & Frishauf

[57] ABSTRACT

To improve the bonding layer for connecting wires to semiconductor chips with contact fingers, or contact strips, on a substrate carrier, the bonding layer is formed as spongy, microporous structure, applied to discrete positions of the contact strips by screen printing, and secured to the metallic connecting strip by a diffusion zone. Preferably, the bonding layer comprises a metal of gold, palladium, silver, aluminum and copper, or an alloy of at least two of these metals, or a base alloy of one of these metals, for example gold applied as a gold paste having an average grain size of less than 5 micrometers, the layer being between 2 to 30 micrometers thick, preferably 3 to 10 micrometers. The metal is part of a paste of the metal in an evaporative organic carrier. After screen printing, the carrier is eliminated by heating; subsequent heating converts the metal to a spongy microporous structure bonded to the substrate carrier by a diffusion zone.

7 Claims, 5 Drawing Figures

METHOD OF MAKING METALLIC SUPPORT CARRIER FOR SEMICONDUCTOR ELEMENTS

This is a division of application Ser. No. 560,532, filed Mar. 20, 1975, now U.S. Pat. No. 4,027,326, May 3, 1977.

The present invention relates to semiconductor structures, and more particularly to support structures for semiconductor chips, known as lead frames, and to the contacting arrangement, in which a group of contact finger or contact strips are placed on a metallic carrier, the contact fingers, each, having a metallic bonding layer for connection to pigtail wires, or connecting wires which, in turn, are connected to the semiconductor chip.

Various types of semiconductor elements are supported on lead frames, forming metallic carriers. The semiconductor elements may be made of silicon or germanium, or other semiconductive materials in which, by suitable treatment processes, structures resulting in circuit elements are generated. The metallic carrier for the semiconductor material itself is formed with a land, island, or other suitably shaped mounting area, which may be raised, or offset, and on which the semiconductor is secured. Customarily, the semiconductor is a single crystal chip. The terminals of the semiconductor itself are connected to contact fingers, contact flags or contact strips formed on the metallic carrier by means of extremely fine wires, made of gold or aluminum, and having a thickness which customarily is between 10 to 50 micrometers. The connection is by means of bonding. To facilitate the connection of the connecting wires or pigtails to the contact fingers of the lead frame, a bonding layer is applied to the strip. The electrical connection between the semiconductor element terminals and the fingers of the lead frame covered by the bonding layer frequently includes a thermal compression process, that is, pressing the wire on the point at which it is to be bonded while simultaneously applying heat. Another attachment method is by ultrasonic bonding.

The bonding layers may be applied to the underlying connecting strips by compression rolling the layer thereover, by electroplating, or by evaporation. The galvanic process, which is widely used in the manufacture of semiconductor carriers is essentially a batch process, and can be used in a continuous production process only with great difficulty. Bonding regions which are galvanically made are excessively large, since a decrease of the thickness of the bonding layer to a value of zero in the edge zones can be obtained only gradually. It is not possible to vary the composition of the bonding layer in such wide limits, when applied galvanically, as is frequently desired. Bonding layers which are applied galvanically, or by vaporization, sputtering, or by mechanical plating, are compact. Upon application of the extremely fine wire to the bonding layer on the connecting strip or finger, fissures or breakage of the wire present continuous problems. Contaminating material is sometimes additionally deposited (so-called plating skins), if the bonding layer is applied by plating. Such materials, particularly if in the form of surface layers, may interfere with the eventual utilization of the finished semiconductor element, and decrease the mechanical reliability thereof upon mechanical, particularly dynamic loading of the resulting semiconductor structure.

The bonding layers frequently use precious metals, and increasing the size of the bonding layer, or the application zone thereof, increases the requirement for the precious metals. Applying bonding layers at discrete positions of the contact fingers or contact strips only has not been possible when using efficient production methods and systems. Customarily, the metallic carrier is punched out from a strip or ribbon, the surface of which is at least partially coated with the bonding layer. The metallic carrier and its connecting flags are punched from this strip and any punched-out, removed pieces will be coated with precious metals, although being waste or scrap. Reclaiming the precious metals from this punched scrap additionally increases the costs of manufacture.

Reference is made to: U.S. Pat. No. 3,839,782, Milan L. Lincoln, and cross references there listed for are exposition of this technology; and "Electronics", May 16, 1974, page 89–95 (relating to packaging).

It is an object of the present invention to provide a bonding layer for semiconductor connecting fingers, flages or strips, applied to a metallic carrier, which permits connection or bonding of fine wires, in the order of between 10 to 50 micrometers, for example, which provides for an improved final bond and in which inefficient utilization of precious metals is effectively avoided. As an ancillary object, the composition of the bonding layer should be readily variable, so that it can be easily matched to the composition of the connecting wire or pigtail.

SUBJECT MATTER OF THE PRESENT INVENTION

Briefly, the bonding layer is a spongy, microporous structure which is applied to discrete positions, locations or zones of the contact flags or strips by a screen printing process (which process is known as such); the bonding layer and the metallic contact finger or flag, or strip are secured together by means of a diffusion zone.

Bonding layers are made of a metal from the group comprising gold, palladium, silver, aluminum and copper, or an alloy of at least two metals of this group. Base alloys of a metal of this group have been found suitable. Particularly good results are obtained if the bonding layers are made of gold which is applied by screen printing a gold paste, in which the gold particles have a median grain size of less than 5 micrometers. The printing paste, or gold ink has from 30–95% (by weight) preferably about 60–90% fine gold particles dispersed in an organic carrier. The screening medium is preferably, as known, a suitable resin in a carrier having an elevated boiling point, e.g. Decanol or Butylcarbitolacetate, or a mixture of such carriers. Preferably, the thickness of the bonding layer is in the range of between 2 and 30 micrometers, desirably between 3 and 10 micrometers. The metallic substrate carrier can prefereably be made of a metal, or an alloy of one or more of the metals: copper, nickel, iron, or cobalt.

The substrate carrier with the bonding layer, made in accordance with the inventive concept, has several advantages which are obtained only by the combination of the characteristics of the invention. The spongy, microporous structure of the bonding layer easily permits intimate connection of the extremely fine wire, by rubbing it against the bonding layer, or by applying pressure between the wire and the bonding layer, and the connecting strip. The connecting wire, preferably, is gold or aluminum which electrically connects the bonding layer with the semiconductor element. Breakage of the extremely fine connecting wire is reduced to a minimum. Kinks or break-points, fissures, or the like in the connecting wire are likewise effectively removed, so that the finished semiconductor element will have a high mechanical reliability, even when subject to shock. Waste and loss of precious metals are entirely avoided when the bonding layer is applied by a screen printing process, since screen printing by means of a stencil permits application of the bonding layer at the discrete desired positions of the contact fingers only. The bonding layer is secured, or bonded to the contact strip by a diffusion zone, which diffusion zone ensures good mechanical and electrical connection.

The invention will be described by way of example with reference to the accompanying drawings, wherein.

Figure 4:
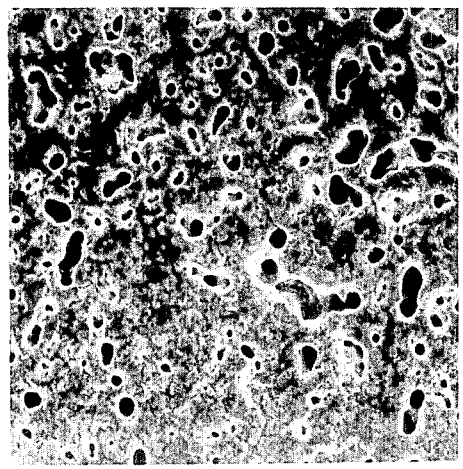

and FIG. 4 is a micro-photograph of the top view of the porous metallizing layer, to an enlargement of about 1:1,600.

A metallic carrier or lead fram 1 has contact finger 2, and a central land, or island 3 formed thereon. A semiconductor element 4 is secured to the island 3, for example by means of an adhesive. Electrical connection between the semiconductor element and the contact fingers is effected by very fine wires 5 made, for example, of gold or of aluminum. The contact fingers 2 have bonding layers 6 applied thereto at discrete locations. These bonding layers have a spongy, net or mesh-like microporous structure.

MAKING AND APPLYING A BONDING LAYER

By means of a stencil, and using a customary screen printing process, a paste dot 16, for example (and preferably) a gold paste, is applied to a substrate carrier web 11. The printing paste includes the material used for bonding by screen printing, that is, gold, for example; the gold is suspended in an organic carrier medium, the gold itself being present in finely divided form. The average grain size of the bonding metal particles is less than 5 micrometers. The organic screen printing carrier may consist — as known — of a resin which is dissolved in a solvent. Commercial or screening media, or screen printing binders may be used, for example as used to make resistance pastes; a resin is preferred which can readily be evaporated under the influence of heat, while avoiding the formation of dissociation products rich in carbon in the layer of the bonding material. Polymethacrylate dissolved in terpineol, has been found suitable. A wax dissolved in an organic liquid solvent may also be used. Basically, the screening media should be capable of readily evaporating, or dissociating, when heated. They are only used to give the paste the desired consistency for printing. The mixture, preferably, is thixotropic, i.e., the viscosity decreases when under compression — to facilitate screen printing — and then resuming its high viscosity thus holding the shape of the print stencil before being fired. After printing, the layer printed at the discrete positions on the contact flages or strips is dried and then heat-treated in a furnace, in which first the organic binder is driven off, or evaporated; thereafter, the bonding layer and the metallic contact strip or flag are secured or bonded together by diffusion. The heat treatment may be carried out in an inert or reducing atmosphere, if desired, in order to prevent oxidation, if the carriers 11 are made of a material subject to oxidation. To make the lead frame of FIG. 1, the initial tape or strip 11, on which the bonding layer spots 16 are printed in discrete positions, is then punched in accordance with a predetermined pattern, as determined by a die. The result is a metal strip of adjacent lead frames, with connecting rails 8, 8' and lateral frame rails 9, 9'; the lead frames can be severed into individual units after encapsulation of the completed assembly (see for example, U.S. Pat. No. 3,839,782).

Figure 1:
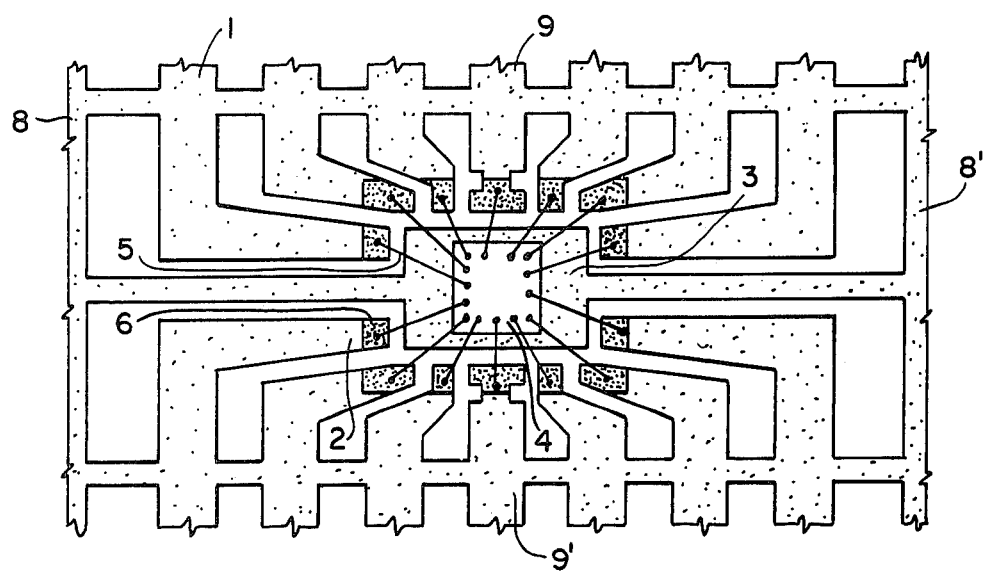
FIG. 1 is a top view of a lead frame to which a semiconductor chip is secured, and using the bonding layer in accordance with the present invention.
Figure 1A:
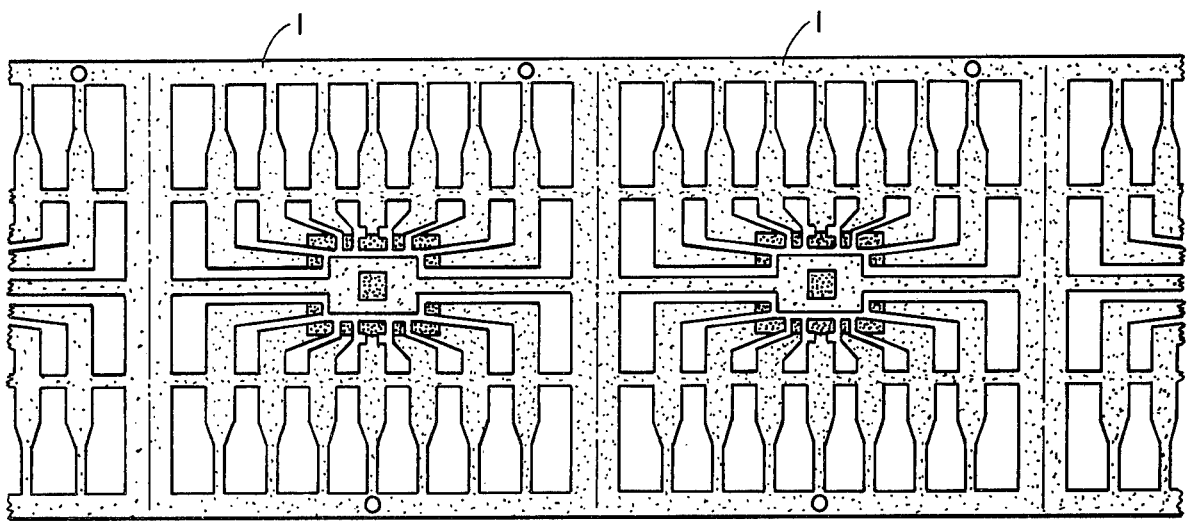
FIG. 1a is a schematic top view of a number of lead frames secured together and punched from a tape, before severing into individual lead frames, for subsequent trimming off the frame portions attachment to a carrier or after encapsulation.
Figure 2:
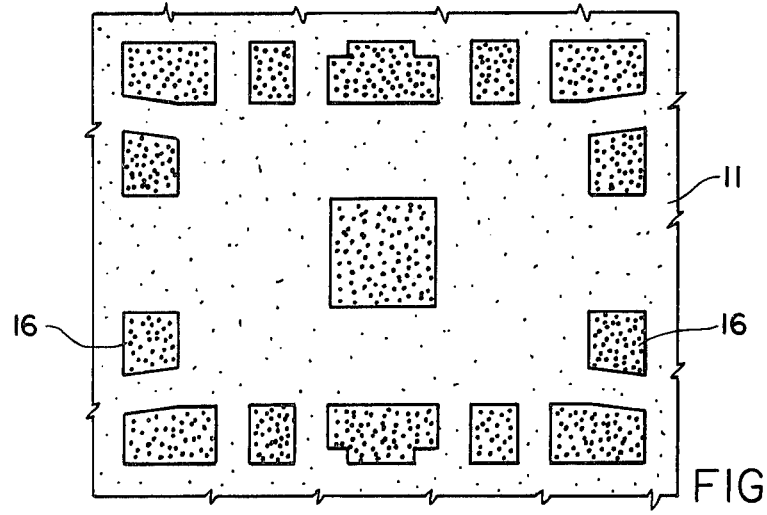
FIG. 2 is greatly enlarged top view of the printed bonding areas applied to a flat strip of carrier material for a single lead frame, and from which the lead frames of FIG. 1a then can be punched.
Figure 3:
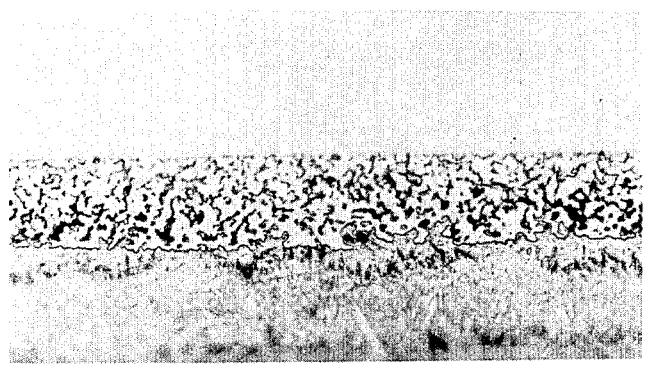
FIG. 3 is a micro-photograph of the cross section through a contact finger with the porous layer applied, greatly enlarged (enlargement of about 1:1000)

Example: A substrate carrier strip 11 is made of an alloy which, essentially, is made of 53% iron, 28.7% nickel, 17.5% cobalt, and containing less than 1% silicon and manganese. Gold is applied at discrete points or zones on this carrier strip on discrete separate positions 16 such as dot-like zones by screen printing. To so apply the gold, a gold paste is applied over a plastic screen having 90 filaments per centimeter. The gold paste used contains 85% (by weight) gold powder having an average or mean grain size of 2 micrometers, dispersed in 15% (by weight) of a screening medium. The screening medium or screening oil is a solution of 17.5% (by weight) of a polymethacrylate resin in alpha ($\alpha$) -terpineol. The substrate carrier strip or tape 11 (FIG. 2) with the paste applied thereon at areas 16, is first heat-treated at 400° C in order to dry the paste and to expel the organic carrier. Thereafter, the strip 11 is heated to glow temperature in a reducing atmosphere, that is, to about 650° C in a hydrogen atmosphere. It is maintained at glow temperature for about 2 minutes. Diffusion will result between the metallic substrate carrier and the bonding layer during that time at that temperature. The fine gold particles will sinter the paste to a microporous layer having spongy structure, and a thickness of between 3 and 30 micrometers. Thereafter, the strip 11 is punched to obtain the strip or tape shown in FIG. 1a; each of the lead frames will have a bonding layer at locations 6. Individual lead frames are illustrated in FIG. 1; they can be obtained by severing the frames from the strip. In manufacture, it may be desirable to secure the semiconductor chip to its location on the center island, then connect the semiconductor terminals by means of the pigtail or connecting wires to the respective fingers by connecting the fine gold wires to the bonding layers, then encapsulating the semiconductor and adjacent portions of the fingers, and only then severing the lead frame from the tape, possibly shaping the fingers to form insertion lugs, for handling by automatic electronic component insertion machinery. The lead frame, or assembly of lead frames on the tape (FIG. 1a) is supported on a transport carrier while carrying out the steps of assembling the semiconductor chips, and the connecting wires to the lead frame.

Various change and modifications may be made within the scope of the inventive concept.

We claim:

1. Method to make a metallic carrier for semiconductor elements and to form attachment terminals for lead wires for connection to the semiconductor structure comprising forming a metal substrate with contact fingers;

screen printing on at least one contact finger of the metal substrate at discrete bonding positions thereon, a paste comprising a bonding metal in finely distributed form in an organic evaporative carrier;

heat treating said substrate with said printed paste thereon to eliminate said carrier;

and further heat treating the remainder of said paste from which the carrier was eliminated, and the substrate, at a temperature sufficiently high to effect diffusion of said bonding metal with the contact finger of said substrate to form an electrical and mechanical bond in form of a diffusion zone and to convert the bonding layer material of said discrete positions to a spongy, microporous structure.

2. Method according to claim 1, wherein said bonding metal is gold having an average particle size of less than 5 micrometers, dissolved in an organic solvent;

said first heat-treating step comprises heating the substrats, with said gold paste printed thereon, to a temperature of about 400° C to dry the paste and to eliminate the organic carrier;

and thereafter heat-treating the substrate and the heat-treated carrier at a temperature of about 650° C, for a time sufficient to effect diffusion.

3. Method according to claim 2, wherein said second heat-treating step, to effect diffusion, is carried out in a reducing atmosphere.

4. Method according to claim 2, wherein said second heat treatment step is carried out for a time, and at a temperature, sufficient to sinter the gold particles of the gold paste to a microporous layer of spongy structure having a thickness of between 3 to 10 micrometers.

5. Method according to claim 1, wherein said substrate is supplied in form of a ribbon or tape, and the step of forming the contact fingers comprises punching the tape with the bonding layer applied to discrete positions or zones on said tape, only, after said final heating step, to form a lead frame.

6. Method according to claim 1 wherein the material of the bonding layer comprises an alloy of at least two of the metals selected from the group consisting of gold, palladium, silver, aluminum and copper.

7. Method according to claim 1 wherein the material of the bonding layer comprises a base alloy of a metal selected from at least one of the group consisting of gold, palladium, silver, aluminum and copper.

* * * * *